US012757630B2

(12) United States Patent
Nie et al.

(10) Patent No.: US 12,757,630 B2
(45) Date of Patent: Oct. 6, 2026

(54) MODIFIED ZINC OXIDE NANOPARTICLES, METHOD FOR MODIFYING THEREOF, AND QUANTUM DOT LIGHT-EMITTING DIODE

(71) Applicant: TCL TECHNOLOGY GROUP CORPORATION, Huizhou (CN)

(72) Inventors: Zhiwen Nie, Huizhou (CN); Wenyong Liu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 901 days.

(21) Appl. No.: 17/847,835

(22) Filed: Jun. 23, 2022

(65) Prior Publication Data

US 2022/0336746 A1 Oct. 20, 2022

Related U.S. Application Data

(63) Continuation of application No. PCT/CN2020/139105, filed on Dec. 24, 2020.

(30) Foreign Application Priority Data

Dec. 25, 2019 (CN) ......................... 201911352574.4

(51) Int. Cl.

| | |
|---|---|
| ***H10K 85/60*** | (2023.01) |
| ***B01J 2/30*** | (2006.01) |
| ***C09C 1/04*** | (2006.01) |
| ***C09C 3/08*** | (2006.01) |
| *H10K 50/115* | (2023.01) |
| *H10K 50/16* | (2023.01) |
| *H10K 102/10* | (2023.01) |

(52) U.S. Cl.

CPC ............ *H10K 85/60* (2023.02); *C09C 1/043* (2013.01); *C09C 3/08* (2013.01); *C01P 2004/64* (2013.01); *C01P 2006/40* (2013.01); *H10K 50/115* (2023.02); *H10K 50/16* (2023.02); *H10K 2102/101* (2023.02)

(58) Field of Classification Search

None

See application file for complete search history.

(56) References Cited

U.S. PATENT DOCUMENTS

| | | | | |
|---|---|---|---|---|
| 7,666,506 | B2 | 2/2010 | Rieger et al. | |
| 9,327,994 | B2 | 5/2016 | Yoshikawa et al. | |
| 2010/0221525 | A1 | 9/2010 | Jonschker et al. | |
| 2010/0242344 | A1 * | 9/2010 | Tock ....................... | F02B 43/02 44/357 |
| 2020/0308017 | A1 | 10/2020 | Cheng et al. | |

FOREIGN PATENT DOCUMENTS

| | | | |
|---|---|---|---|
| CN | 101189307 | A | 5/2008 |
| CN | 101312911 | A | 11/2008 |
| CN | 101880482 | A | 11/2010 |
| CN | 103084181 | A * | 5/2013 |
| CN | 104395241 | A | 3/2015 |
| CN | 106544002 | A | 3/2017 |
| CN | 106634948 | A | 5/2017 |
| CN | 107010651 | A | 8/2017 |
| CN | 107129596 | A | 9/2017 |
| CN | 108529662 | A | 9/2018 |
| CN | 109148695 | A | 1/2019 |
| CN | 109935735 | A * | 6/2019 |
| JP | 2005264089 | A | 9/2005 |
| WO | 0134564 | A1 | 5/2001 |

OTHER PUBLICATIONS

Registry Data of CAS No. 683-10-3, provided by STN (no date).*
Machine translation of CN-108529662-A (no date).*
Machine translation of CN-109935735-A (no date).*
Registry Data of CAS No. 683-10-3, provided by Chemical Book (no date).*
Machine translation of CN-103084181-A (no date).*
"Quantum Dot Light Emitting Diodes with ZnO Electron Transport Layer", Chinese Journal of Luminescence, Apr. 2017, vol. 38, No. 4, 7 Pages.
"Synthesis of ZnO Photocatalysts Using Various Surfactants", Russian Journal of Physical Chemistry: A, 2017, vol. 91. No. 13, pp. 2680-2685.
International Search Report for International Application No. PCT/CN2020/139105; Date of Completion: Feb. 8, 2021; Date of Mailing: Mar. 23, 2021; 5 Pages.
Translation of International Search Report for International Application No. PCT/CN2020/139105; Date of Completion: Feb. 8, 2021; Date of Mailing: Mar. 23, 2021; 3 Pages.
Written Opinion for International Application No. PCT/CN2020/139105; Date of Completion: Mar. 17, 2021; Date of Mailing: Mar. 23, 2021; 6 Pages.

* cited by examiner

*Primary Examiner* — Michael J Feely

(57) ABSTRACT

The present application discloses a method for modifying zinc oxide nanoparticles, comprising following steps: obtaining zinc oxide solution and betaine ligands; mixing the zinc oxide solution and the betaine ligand, keeping a resulting mixed solution reacted under a protective gas atmosphere at a preset temperature, and separating a modified zinc oxide from the resulting mixed solution to obtain a modified zinc oxide. The method for modifying zinc oxide nanoparticles provided in the present application is simple and quick to operate, suitable for industrial production and meets application requirements. And the modified zinc oxide with betaine ligands grafted on the surface has good stability and excellent monodisperse performance, hinders the transmission rate of electrons to a certain extent and improves the recombination efficiency of electrons and holes in the quantum dot light-emitting layer.

10 Claims, 1 Drawing Sheet

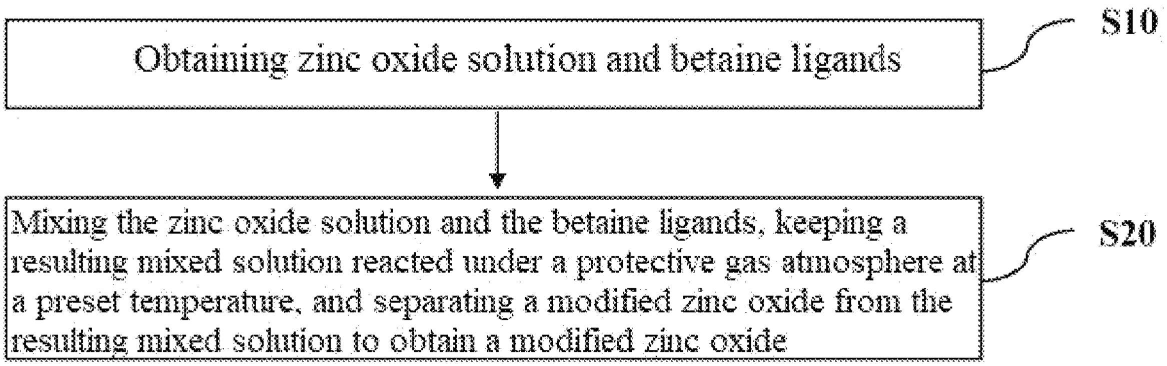
Obtaining zinc oxide solution and betaine ligands
S10
Mixing the zinc oxide solution and the betaine ligands, keeping a resulting mixed solution reacted under a protective gas atmosphere at a preset temperature, and separating a modified zinc oxide from the resulting mixed solution to obtain a modified zinc oxide
S20

MODIFIED ZINC OXIDE NANOPARTICLES, METHOD FOR MODIFYING THEREOF, AND QUANTUM DOT LIGHT-EMITTING DIODE

CROSS-REFERENCE TO RELATED APPLICATIONS

This application is a continuation application of International Patent Application No. PCT/CN2020/139105 with an international filing date of Dec. 24, 2020, designating the United States, now pending, and further claims priority benefits to Chinese Patent Application No. 201911352574.4 filed Dec. 25, 2019. The contents of all of the aforementioned applications, including any intervening amendments thereto, are incorporated herein by reference.

BACKGROUND

Technical Field

The present application relates to the technical field of light-emitting diodes, in particular, to a method for modifying zinc oxide nanoparticles, modified zinc oxide nanoparticles and quantum dot light-emitting diode.

Description of Related Arts

The statements herein merely provide background information related to the present application and do not necessarily constitute prior art.

At present, the most fundamental problem restricting the development of QLED is that holes and electrons cannot be effectively recombined in the quantum dot light-emitting layer. Usually, the injection of electrons is more than the injection of holes. Therefore, it is of great significance to balance the injection of electrons and holes to improve the overall performance of QLEDs.

In the field of QLED technology, zinc oxide nanomaterials are often used as the electron transportation layer, which can significantly improve the recombination efficiency of carriers in the quantum dot light-emitting layer.

However, on the one hand, the existence of hydroxyl, carboxyl and surface defect states on the surface of zinc oxide nanoparticles is very easy to act as a non-radiative relaxation center, causing the loss of photocurrent, resulting in the degradation of QLED device performance. On the other hand, the abundant hydroxyl group on the surface of zinc oxide nanoparticles can cause direct hydrogen bonding of nanoparticles, which leads to agglomeration between particles and irreversible effects on their dispersibility. In addition, the abundant hydroxyl group on the surface of zinc oxide nanoparticles leads to an excess of electrons injected into the quantum dot light-emitting layer through the zinc oxide film.

SUMMARY

One purpose of the Examples of the present application is to provide a method for modifying zinc oxide nanoparticles, modified zinc oxide nanoparticles and quantum dot light-emitting diode, which aims to solve the application problem of zinc oxide nanoparticles.

In order to solve the above-mentioned technical problems, the technical solutions adopted in the Examples of the present application are:

In a first aspect, a method for modifying zinc oxide nanoparticles is provided and includes following steps: zinc oxide solution and betaine ligands are obtained. The zinc oxide solution and the betaine ligand are mixed and kept reacted under a protective gas atmosphere at a preset temperature. And a modified zinc oxide is separated from the resulting mixed solution to obtain a modified zinc oxide.

In a second aspect, a modified zinc oxide nanoparticles are provided, including zinc oxide nanoparticles, and the betaine ligands are grafted on the surface of the zinc oxide nanoparticles.

In a third aspect, a quantum dot light-emitting diode is provided, the quantum dot light-emitting diode is prepared by an anode, a cathode, a quantum dot light-emitting layer and an electron transportation layer. The anode and cathode are arranged opposite to each other, the quantum dot light-emitting layer is arranged between the anode and the cathode, the electron transportation layer is arranged between the cathode and the quantum dot light-emitting layer. A material of the electron transportation layer includes the zinc oxide nanoparticles obtained by the above-mentioned method, or includes the above-mentioned modified zinc oxide nanoparticles.

BENEFICIAL EFFECT

The beneficial effect of the method for modifying zinc oxide nanoparticles provided by the Examples of the present application is summarized as follows: the zinc oxide solution and betaine ligands are mixed and reacted under a protective gas atmosphere at preset temperature, and zinc oxide was separated to obtain modified zinc oxide with betaine ligands grafted on the surface. The betaine ligands have —N+ group and —COO group. During the reaction process, the —N+ group in betaine ligands can bind with the anions on the surface of zinc oxide nanoparticles through electrostatic force, and the —COO group can interact with the $Zn^{2+}$ on the surface of zinc oxide nanoparticles through electrostatic force. Therefore, betaine ligands can bind very strongly to the surface of zinc oxide nanoparticles, ensuring that the modified zinc oxide grafted with betaine ligands on the surface has good stability. In addition, the branched chain of betaine ligands can increase the steric hindrance, which can not only effectively prevent the agglomeration between particles due to the hydrogen bonding of hydroxyl bonds, but also significantly improve the monodispersity of zinc oxide nanoparticles. The existence of some branched chain can hinder the transmission rate of electrons to a certain extent, thereby improving the recombination efficiency of electrons and holes in the quantum dot light-emitting layer, and greatly improving the performance indicators of quantum dot light-emitting diode devices. In addition, the method for modifying zinc oxide nanoparticles provided in this application is simple and fast to operate, suitable for industrial production, and meets application requirements.

The beneficial effects of the modified zinc oxide nanoparticles provided in the Examples of the present application are that betaine ligands are grafted on the surface of the modified zinc oxide nanoparticles, and the betaine ligands are very strongly combined with the surface of the zinc oxide nanoparticles and have good stability. In addition, the branched chain part of betaine ligands can increase the steric hindrance. On the one hand, the branched chain part of betaine ligands can effectively prevent the agglomeration between particles due to the hydrogen bonding of hydroxyl bonds, which significantly improves the monodispersity of zinc oxide nanoparticles. On the one hand, when the zinc oxide was applied to quantum dot light-emitting devices, the existence of the branched chain part of the surface-grafted betaine ligands can hinder the electron transmission rate to a certain extent, improve the recombination efficiency of electrons and holes in the quantum dot light-emitting layer and greatly improves the performance indicators of the quantum dot light-emitting diode device.

The beneficial effects of the quantum dot light-emitting diode provided by the Examples of the present application are summarized as follows: due to the above-mentioned good stability, excellent monodispersity performance, and the existence of modified zinc oxide nanoparticles that can hinder the transmission rate of electrons to a certain extent, the improvement of recombination efficiency of electron and the holes in the quantum dot light-emitting layer greatly improves the performance indicators of the quantum dot light-emitting diode device.

DESCRIPTION OF DRAWINGS

FIG. 1 is a schematic flowchart of the method for modifying zinc oxide nanoparticles provided in the Example of the present application.

DETAILED DESCRIPTIONS

In order to make the objectives, technical solutions and advantages of the present application clearer, the present application will be further described in detail below with reference to the accompanying drawings and Examples. It should be understood that the specific Examples described herein are only used to explain the present invention, but not to limit the present application.

As shown in FIG. 1, some Examples of the present application provide a method for modifying zinc oxide nanoparticles, including the following steps:

S10. Obtaining zinc oxide solution and betaine ligands;

S20. Mixing the zinc oxide solution and the betaine ligands, keeping a resulting mixed solution reacted under a protective gas atmosphere at preset temperature, and separating a modified zinc oxide from the resulting mixed solution to obtain modified zinc oxide.

In the method for modifying zinc oxide nanoparticles provided in the Examples of this application, zinc oxide solution and betaine ligands were mixed, reacted under a protective gas atmosphere at preset temperature, and separated to obtain modified zinc oxide with betaine ligands grafted on the surface. The betaine ligands have —N+ group and —COO group. During the reaction process, the —N+ group in betaine ligands can bind with the anions on the surface of zinc oxide nanoparticles through electrostatic force, and the —COO group can interact with the $Zn^{2+}$ on the surface of zinc oxide nanoparticles through electrostatic force. Therefore, the betaine ligands can bind very strongly to the surface of zinc oxide nanoparticles, ensuring that the modified zinc oxide grafted with betaine ligands on the surface has good stability. In addition, the branched chain part of betaine ligands can increase the steric hindrance, which can not only effectively prevent the agglomeration between particles due to the hydrogen bonding of hydroxyl bonds, but also significantly improve the monodispersity of zinc oxide nanoparticles. The existence of branched chain parts can hinder the transmission rate of electrons to a certain extent, thereby improving the recombination efficiency of electrons and holes in the quantum dot light-emitting layer, and greatly improving the performance indicators of quantum dot light-emitting diode devices. In addition, the method for modifying zinc oxide nanoparticles provided in the Examples of the present application is simple and fast to operate, suitable for industrial production, and meets application requirements.

Specifically, in the above step S10, zinc oxide solution and betaine ligands were obtained. The zinc oxide and betaine ligands were used as raw materials in the Examples of the present application. Zinc oxide nanoparticles often have poor crystallinity, and there are a large number of hydroxyl group, carboxyl group and surface defect states on the surface, especially those zinc oxide nanoparticles prepared by low-temperature solution method, which has the advantages of low production cost, simple process, fast operation, green environmental protection, etc. and is the main preparation method of zinc oxide nanomaterials at present. In the field of QLED technology, the zinc oxide material used in the electron transportation layer is generally prepared by a low-temperature solution method. A large number of hydroxyl group, carboxyl group and surface defect states exist on the surface of zinc oxide nanoparticles, which not only lead to easy agglomeration between zinc oxide particles, but also affect the QLED device performance.

In some Examples, the solvent in the zinc oxide solution was at least one selected from the group consisting of water, ethanol, methanol, propanol, and formamide. The solvent in the zinc oxide solution in the Examples of the present application was at least one polar solvent selected from the group consisting of water, ethanol, methanol, propanol or formamide. These polar solvents not only have good solvent properties for zinc oxide, but also have good solubility for betaine. The ligands also have excellent solubility and can provide a solvent environment for the modification reaction between ZnO and betaine ligands. In the Examples of the present application, zinc oxide was fully dissolved in a polar solvent in advance, so that betaine ligands can be added after the addition of betaine ligands to quickly and uniformly react with zinc oxide, thereby improving the uniformity and adequacy of the reaction.

In some Examples, the zinc oxide solution has a concentration of 5-20 mg/mL. The concentration of zinc oxide solution in the Examples of this application is 5-20 mg/mL, which ensures the material basis and reaction environment for subsequent betaine ligands to modify zinc oxide nanoparticles. If the concentration of zinc oxide solution is too high or too low, which is not conducive to the modification of zinc oxide nanoparticles by betaine ligands.

In some Examples, the zinc oxide solution was prepared by dissolving zinc oxide in at least one polar solvent selected from the group consisting of water, ethanol, methanol, propanol and formamide to form a solution with a concentration of 5 mg/mL, 10 mg/mL, 15 mg/mL or 20 mg/mL.

In the Examples of the present application, the betaine ligands have —N+ group, —COO group and long branched chain. In some Examples, the betaine ligands are at least one selected from the group consisting of N-Dodecyl-N,N-Dimethylglycine (CAS: 683-10-3), tetradecyl dimethyl betaine (CAS: 2601-33-4), hexadecyl dimethyl betaine (CAS: 693-33-4), octadecyl dimethyl betaine (CAS: 820-66-6), cocamidopropyl betaine (CAS: 61789-40-0), and sodium lauroamphoacetate (CAS: 156028-14-7). The betaine ligands used in the Examples of this application not only have —N+ group and —COO group, but also have longer branched chains, wherein the —N+ group can bind to the anions on the surface of zinc oxide nanoparticles through electrostatic force. The —COO group can be combined with $Zn^{2+}$ on the surface of zinc oxide nanoparticles through electrostatic force to improve the stability of the modified zinc oxide nanoparticles. In addition, the long-chain branched part of betaine ligands has a longer steric hindrance. On the one hand, the branched long-chain part of betaine ligands can effectively prevent the agglomeration between particles due to the hydrogen bonding of hydroxyl bonds, which significantly improves the monodispersity problem; on the other hand, the existence of branched long-chain parts can hinder the electron transmission rate to a certain extent, thereby improving the recombination efficiency of electrons and holes in QLED devices, and greatly improving the performance indicators of QLED devices.

Specifically, in the above step S20, after the zinc oxide solution and the betaine ligands being mixed and reacted under a protective gas atmosphere at the preset temperature, zinc oxide was separated to obtain modified zinc oxide. In the Examples of the present application, after mixing the zinc oxide solution and the betaine ligands, the reaction under a protective gas atmosphere at preset temperature promotes the electrostatic interaction between the —N+ group on the surface of the betaine ligands and the anion on the surface of the zinc oxide nanoparticles. The —COO group and $Zn^{2+}$ on the surface of zinc oxide nanoparticles are combined with each other through electrostatic force, which ensures the adequacy of the modification of zinc oxide nanoparticles by betaine ligands, and obtains modified zinc oxide with betaine ligands grafted on the surface.

In some Examples, after mixing the zinc oxide solution and the betaine ligands, a reaction under a protective gas atmosphere at a temperature of 25-100° C. The temperature condition promotes the —N+ group on the surface of the betaine ligands to interact with the anions on the surface of zinc oxide nanoparticles and the —COO group have better mutual binding effect with $Zn^{2+}$ on the surface of zinc oxide nanoparticles. The reaction time can be determined according to the specific type of betaine ligands, as long as betaine ligands can modify zinc oxide nanoparticles. As long as the property is sufficient, in some Examples, the reaction time is 5 minutes to 12 hours.

In some specific Examples, after the zinc oxide solution and the betaine ligands being mixed and reaction was kept under the atmosphere of nitrogen, argon, helium or a mixture thereof at a temperature of 25° C., 50° C., 75° C., 90° C. or 100° C. for 5 minutes, 30 minutes, 1 hour, 3 hours, 6 hours, 8 hours, 10 hours or 12 hours, and then zinc oxide was separated to obtain the modified zinc oxide with betaine ligands grafted on the surface.

In some Examples, in the system after the zinc oxide solution and the betaine ligands were mixed, the mass ratio of the betaine ligands to the zinc oxide nanoparticles is (0.1-1):1. In the reaction system of the Examples of this application, the mass ratio of betaine ligands to zinc oxide nanoparticles is (0.1-1):1, which ensures the adequacy of betaine ligands for modification of zinc oxide nanoparticles and makes betaine ligands fully interact with the group, anions, defect states and $Zn^{2+}$ on the surface of zinc oxide nanoparticles, which makes the modification of zinc oxide nanoparticles sufficient, effectively passivate the hydroxyl group, carboxyl group and surface defect states on the surface of zinc oxide nanoparticles, improves the monodispersity of zinc oxide nanoparticles and slows down the efficient injection of electrons. If the mass ratio of betaine ligands to zinc oxide nanoparticles is too low, the modification of zinc oxide nanoparticles by betaine ligands is insufficient. In some Examples, the mass ratio of betaine ligands to zinc oxide nanoparticles is 0.1:1, 0.2:1, 0.5:1, 0.7:1, 0.9:1, or 1:1.

In some Examples, the protective gas atmosphere is at least one selected from the group consisting of nitrogen, argon, and helium. At least one protective gas among nitrogen, argon, and helium in the Example of the present application prevents the metal elements in the zinc oxide from being oxidized and destroyed during the reaction process, and simultaneously avoids the occurrence of side reactions.

In some Examples, after the step of mixing the zinc oxide solution and the betaine ligands, and keeping reaction under a protective gas atmosphere at a temperature of 25-100° C., the method further includes: cooling the obtained reaction system, adding a second solvent for precipitation and centrifugation to obtain modified zinc oxide with betaine ligands grafted on the surface. In the Examples of the present application, after mixing the zinc oxide solution and the betaine ligands, and keeping reaction under a protective gas atmosphere at a temperature of 25-100° C., the reaction system was cooled to room temperature, and then a second solvent was added for precipitation and centrifugation and the modified zinc oxide with betaine ligands grafted on the surface was obtained after purification.

In some Examples, the second solvent is selected from: ethyl acetate and/or methyl acetate. The ethyl acetate and/or methyl acetate solvents in the Examples of this application have a good purification effect on the modified zinc oxide with betaine ligands grafted on the surface of the reaction system. Centrifugal separation can obtain the purified modified zinc oxide with betaine ligands grafted on the surface.

Correspondingly, the Examples of the present application also provide modified zinc oxide nanoparticles, including zinc oxide nanoparticles, and the betaine ligands were grafted on the surface of the zinc oxide nanoparticles.

The surfaces of the modified zinc oxide nanoparticles provided in the Examples of this application are grafted with betaine ligands, and the betaine ligands were very strongly bounded to the surface of zinc oxide nanoparticles and have good stability. In addition, the branched chain part of betaine ligands can increase the steric hindrance. On the one hand, the branched chain part can effectively prevent the agglomeration between particles due to the hydrogen bonding of hydroxyl bonds, which significantly improves the monodispersity of zinc oxide nanoparticles. On the one hand, when the zinc oxide was applied to quantum dot light-emitting devices, the existence of the branched chain part of the surface-grafted betaine ligands can hinder the electron transmission rate to a certain extent, thereby improving the recombination efficiency in the quantum dot light-emitting diode and greatly improving the performance indicators of the quantum dot light-emitting diode device.

The modified zinc oxide nanoparticles provided in the Examples of this application was prepared by the above method for modifying zinc oxide nanoparticles.

Correspondingly, an Example of the present application also provides a quantum dot light-emitting diode, the quantum dot light-emitting diode was prepared by an anode, a cathode, a quantum dot light-emitting layer and an electron transportation layer. The anode and cathode were arranged opposite to each other, the quantum dot light-emitting layer was arranged between the anode and the cathode, the electron transportation layer was arranged between the cathode and the quantum dot light-emitting layer. A material of the electron transportation layer includes the zinc oxide nanoparticles obtained by the above-mentioned method, or includes the above-mentioned modified zinc oxide nanoparticles.

The quantum dot light-emitting diodes provided in the Examples of the present application have the above-mentioned good stability, excellent monodispersity performance, and the existence of modified zinc oxide nanoparticles that can hinder the transmission rate of electrons to a certain extent and improve the recombination efficiency in the light-emitting layer greatly and improve the performance indicators of the quantum dot light-emitting diode device.

Specifically, the quantum dot light-emitting diode in the Examples of the present application is divided into a positive type structure and an inverse type structure. Wherein, the positive structure is substrate/anode/quantum dot light-emitting layer/electron transportation layer/cathode, and optionally arranged on a hole functional layer between the anode and the quantum dot light-emitting layer, such as, a hole injection layer, a hole transportation layer and an electron blocking layer. The positive structure is arbitrarily arranged on an electron injection layer between the electron transportation layer and the cathode. The inverse structure is the opposite of the positive structure.

Illustratively, the substrate may be a rigid or flexible substrate. The anode is ITO, FTO or ZTO. The hole injection layer is PEODT:PSS, $WoO_3$, $MoO_3$, NiO, $V_2O_5$, HATCN, HATCN or CuS. The hole transportation layer is TFB, PVK, TCTA, TAPC, Poly-TBP, Poly-TPD, NPB, CBP, PEODT:PSS, $MoO_3$, $WoO_3$, NiO, CuO, $V_2O_5$ or CuS. The quantum dot light-emitting layer may be at least one selected from the group consisting of quantum dots consisting of IIB group and VIA group elements, quantum dots consisting of IIIA group and VA group elements, and quantum dots consisting of IVA group and VIA group elements. For Example, the quantum dot light-emitting layer is CdS, AlAs or SnS. The electron transportation layer is zinc oxide nanoparticles prepared by the above modification method, or contain the above modified zinc oxide nanoparticles, and the thickness is 10-120 nm. The cathode is Al or Ag.

In an optional Example, the thickness of the anode is 30-150 nm; the thickness of the hole injection layer is 30-150 nm; the thickness of the hole transportation layer is 30-180 nm; the thickness of the quantum dot light-emitting layer is 30-180 nm; the thickness of the electron transportation layer is 10-120 nm; the thickness of the cathode is 80-120 nm.

Example 1

A quantum dot light-emitting diode was prepared by the following preparation steps:

S10. Preparation of zinc oxide with N-Dodecyl-N,N-Dimethylglycine (CAS: 683-10-3) grafted on the surface: 75 mg of N-Dodecyl-N,N-Dimethylglycine (CAS: 683-10-3) was added to a 10 mL of ZnO ethanol solution with a concentration of 15 mg/mL, zinc oxide was prepared by low-temperature preparation technology; a resulting mixed solution was stirred for reaction at 80° C. for 30 min. After the reaction, the product was precipitated by ethyl acetate, centrifuged and separated three times to obtain ZnO grafted with N-Dodecyl-N,N-Dimethylglycine (CAS: 683-10-3) on the surface; zinc oxide was prepared by low-temperature preparation technology.

S20. Preparation of a QLED device: a bottom electrode, a hole injection layer, a hole transportation layer, a quantum dot light-emitting layer, an electron transportation layer, and a top electrode were prepared in sequence on the substrate. The substrate was a glass substrate; the bottom electrode was ITO with a thickness of 100 nm; the hole injection layer was PEDOT:PSS with a thickness of 40 nm; the hole transportation layer was TFB with a thickness of 100 nm; the emitting layer was CdZnSe/ZnSe/ZnS with a thickness of 120 nm; the electron transportation layer was the zinc oxide with N-Dodecyl-N,N-Dimethylglycine (CAS: 683-10-3) grafted on the surface obtained in step S10 with a thickness of 60 nm; and the top electrode was Al with a thickness of 50 nm.

Example 2

A quantum dot light-emitting diode was prepared by the following preparation steps:

S10. Preparation of zinc oxide with octadecyl dimethyl betaine (CAS: 820-66-6) grafted on the surface: 75 mg of octadecyl dimethyl betaine (CAS: 820-66-6) was added to a 10 mL of ZnO ethanol solution with a concentration of 15 mg/mL, zinc oxide was prepared by low-temperature preparation technology; a resulting mixed solution was stirred for reaction at 70° C. for 60 min. After the reaction, the product was precipitated, centrifuged and separated three times by ethyl acetate to obtain ZnO with octadecyl dimethyl betaine (CAS: 820-66-6) grafted on the surface;

S20. Basically the same as S20 in Example 1, the main difference is that the zinc oxide with octadecyl dimethyl betaine (CAS: 820-66-6) grafted on the surface obtained in step S10 in this Example is used as the electron transportation layer.

Example 3

A quantum dot light-emitting diode was prepared by the following preparation steps:

S10. Preparation of zinc oxide with cocamidopropyl betaine (CAS: 61789-40-0) grafted on the surface: 75 mg of cocamidopropyl betaine (CAS: 61789-40-0) was added to a 10 mL of ZnO ethanol solution with a concentration of 15 mg/mL, zinc oxide was prepared by low-temperature preparation technology; a resulting mixed solution was stirred for reaction at 90° C. for 30 min. After the reaction, the product was precipitated, centrifuged and separated three times by ethyl acetate to obtain ZnO grafted with cocamidopropyl betaine (CAS: 61789-40-0) on the surface;

S20. Basically the same as S20 in Example 1, the main difference is that the zinc oxide with cocamidopropyl betaine (CAS: 61789-40-0) grafted on the surface obtained in step S10 in this Example is used as the electron transportation layer.

Example 4

A quantum dot light-emitting diode was prepared by the following preparation steps:

S10. Preparation of zinc oxide with sodium lauroamphoacetate (CAS: 156028-14-7) grafted on the surface: 75 mg of sodium lauroamphoacetate (CAS: 156028-14-7) was added to a 10 mL of ZnO ethanol solution with a concentration of 15 mg/mL, zinc oxide was prepared by low-temperature preparation technology; a resulting mixed solution was stirred for reaction at 50° C. for 120 min. After the reaction, the product was precipitated, centrifuged and separated three times by ethyl acetate to obtain ZnO grafted with sodium lauroamphoacetate (CAS: 156028-14-7) on the surface;

S20. It is basically the same as S20 in Example 1, the main difference is that the zinc oxide with sodium lauroamphoacetate (CAS: 156028-14-7) grafted on the surface obtained by step S10 in this Example is used as the electron transportation layer.

Example 5

A quantum dot light-emitting diode was prepared by the following preparation steps:

S10. Preparation of zinc oxide with tetradecyl dimethyl betaine (CAS: 2601-33-4) grafted on the surface: 75 mg tetradecyl dimethyl betaine (CAS: 2601-33-4) was added to 10 mL of ZnO ethanol solution with a concentration of 15 mg/mL, zinc oxide was prepared by low-temperature preparation technology; a resulting mixed solution was stirred for reaction at 60° C. for 360 min. After the reaction, the product was precipitated, centrifuged and separated three times by ethyl acetate to obtain ZnO grafted with tetradecyl dimethyl betaine (CAS: 2601-33-4) on the surface;

S20. Basically the same as S20 in Example 1, the main difference is that the zinc oxide with tetradecyl dimethyl betaine (CAS: 2601-33-4) grafted on the surface obtained in step S10 in this Example is used as the electron transportation layer.

Example 6

A quantum dot light-emitting diode was prepared by the following preparation steps:

S10. Preparation of zinc oxide with hexadecyl dimethyl betaine (CAS: 693-33-4) grafted on the surface: 75 mg hexadecyl dimethyl betaine (CAS: 693-33-4) was added to 10 mL of ZnO ethanol solution with a concentration of 15 mg/mL, zinc oxide was prepared by low-temperature preparation technology; a resulting mixed solution was stirred for reaction at 40° C. for 8 hours. After the reaction, the product was precipitated, centrifuged and separated three times by ethyl acetate to obtain ZnO grafted with hexadecyl dimethyl betaine (CAS: 693-33-4) on the surface;

S20. Basically the same as S20 in Example 1, the main difference is that the zinc oxide with hexadecyl dimethyl betaine (CAS: 693-33-4) grafted on the surface obtained in step S10 in this example is used as the electron transportation layer.

Comparative Example 1

It is basically the same as S20 in Example 1, the main difference is that zinc oxide is used as the electron transportation layer.

In order to verify the progress of the quantum dot light-emitting diodes prepared in Examples 1-6 of the present application, the test Examples of the present application compared the external quantum efficiency (EQEmax) of the quantum dot light-emitting diodes prepared in Examples 1-6 and Comparative Example 1. The test was carried out, and the test results are shown in Table 1 below:

TABLE 1

| | Test object | | | |
|---|---|---|---|---|
| Test item | Comparative Example 1 | Example 1 | Example 2 | Example 3 |
| $EQE_{max}$ (%) | 5 | 12 | 10 | 15 |

| | Test object | | |
|---|---|---|---|
| Test item | Example 4 | Example 5 | Example 6 |
| $EQE_{max}$ (%) | 8 | 11 | 9 |

It can be seen from the above test results that the external quantum efficiencies of the quantum dot light-emitting diodes prepared in Examples 1-6 of the present application are significantly higher than those of the quantum dot light-emitting diodes prepared in Comparative Example 1, indicating that the modified zinc oxide nanoparticles with betaine ligands grafted on the surface used in the electron transportation layer in Examples 1-6 of the present application can improve the recombination efficiency of electrons and holes in the quantum dot light-emitting layer, thereby improving the photoelectric properties such as the external quantum efficiency of quantum dot light-emitting diodes.

The above are only optional examples of the present application, and are not intended to limit the present application. Various modifications and variations of this application are possible for those skilled in the art. Any modification, equivalent replacement, improvement, etc. made within the spirit and principle of this application shall be included within the scope of the claims of this application.

What is claimed is:

1. A quantum dot light-emitting diode, comprising an anode;

a cathode arranged oppositely to the anode;

a quantum dot light-emitting layer arranged between the anode and the cathode; and an electron transportation layer is arranged between the quantum dot light-emitting layer and the cathode;

wherein the electron transportation layer is a film formed from surface modified zinc oxide nanoparticles comprising betaine ligands grafted to the surfaces of zinc oxide nanoparticles;

wherein the betaine ligands are at least one selected from the group consisting of N-dodecyl-N,N-dimethylglycine, tetradecyl dimethyl betaine, hexadecyl dimethyl betaine, octadecyl dimethyl betaine, cocamidopropyl betaine, and sodium lauroamphoacetate;

wherein a mass ratio of the betaine ligands to the zinc oxide nanoparticles is (0.1-1):1; and wherein the betaine ligands prevent agglomeration between particles, while improving recombination efficiency of electrons and holes in the quantum dot light-emitting layer by hindering the electron transmission rate to a certain extent.

2. The quantum dot light-emitting diode according to claim 1, wherein the betaine ligands are at least one selected from the group consisting of tetradecyl dimethyl betaine, hexadecyl dimethyl betaine, octadecyl dimethyl betaine, and sodium lauroamphoacetate.

3. The quantum dot light-emitting diode according to claim 1, wherein the electron transportation layer is prepared by a method comprising the following steps:

obtaining a solution of zinc oxide nanoparticles and the betaine ligands;

mixing the solution of zinc oxide nanoparticles and the betaine ligands to form a mixed solution, reacting the mixed solution for a period of time under a protective gas atmosphere at a preset temperature to form a reaction system containing the surface modified zinc oxide nanoparticles, separating the surface modified zinc oxide nanoparticles from the reaction system; and forming a film with the surface modified zinc oxide nanoparticles to prepare the electron transportation layer;

wherein in the step of mixing the solution of zinc oxide nanoparticles and the betaine ligands, the solution of zinc oxide nanoparticles and the betaine ligands are mixed according to a mass ratio of the betaine ligands to the zinc oxide nanoparticles of (0.1-1):1.

4. The quantum dot light-emitting diode according to claim 3, wherein the solution of zinc oxide nanoparticles comprises at least one solvent selected from the group consisting of water, ethanol, methanol, propanol and formamide.

5. The quantum dot light-emitting diode according to claim 3, wherein the solution of zinc oxide nanoparticles has a zinc oxide nanoparticle concentration of 5-20 mg/mL.

6. The quantum dot light-emitting diode according to claim 5, wherein the protective gas atmosphere is at least one selected from the group consisting of nitrogen, argon, and helium.

7. The quantum dot light-emitting diode according to claim 3, wherein the preset temperature is 25-100° C.

8. The quantum dot light-emitting diode according to claim 7, wherein the step of separating the surface modified zinc oxide nanoparticles from the reaction system comprises: cooling the reaction system, adding a second solvent to carry out precipitation, and centrifugally separating precipitates to obtain the surface modified zinc oxide nanoparticles.

9. The quantum dot light-emitting diode according to claim 8, wherein the second solvent is at least one selected from the group consisting of ethyl acetate and methyl acetate.

10. The quantum dot light-emitting diode according to claim 3, wherein the reaction time under the protective gas atmosphere at the preset temperature is 5 minutes-12 hours.

* * * * *